(12) United States Patent
Thompson et al.

(10) Patent No.: US 6,245,393 B1
(45) Date of Patent: *Jun. 12, 2001

(54) METHOD OF MAKING A DISPLAY

(75) Inventors: Mark E. Thompson, Anaheim Hills, CA (US); Stephen R. Forrest, Princeton, NJ (US)

(73) Assignees: The Trustees of Princeton University, Princeton, NJ (US); The University of Southern California, Los Angeles, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/050,084

(22) Filed: Mar. 30, 1998

Related U.S. Application Data

(62) Division of application No. 08/772,333, filed on Dec. 23, 1996, now Pat. No. 6,013,982.

(51) Int. Cl.[7] .......................................... C08J 7/04
(52) U.S. Cl. ................. 427/511; 427/256; 427/385.5; 427/558; 427/559
(58) Field of Search ................. 427/511, 558, 427/559, 256, 285.5

(56) References Cited

U.S. PATENT DOCUMENTS

| | | |
|---|---|---|
| 4,243,694 * | 1/1981 | Mansukhani ................. 427/14.1 |
| 4,292,107 | 9/1981 | Tanaka et al. . |
| 4,446,174 * | 5/1984 | Maekawa et al. ................. 427/261 |
| 4,651,053 | 3/1987 | Kato et al. . |
| 4,668,533 | 5/1987 | Miller . |
| 5,059,266 | 10/1991 | Yamane et al. . |
| 5,064,711 | 11/1991 | Ito et al. . |
| 5,114,744 | 5/1992 | Cloutier et al. . |
| 5,132,248 | 7/1992 | Drummond et al. . |
| 5,204,055 | 4/1993 | Sachs et al. . |
| 5,247,315 | 9/1993 | Phelan et al. . |
| 5,260,009 | 11/1993 | Penn . |
| 5,266,098 | 11/1993 | Chun et al. . |

(List continued on next page.)

FOREIGN PATENT DOCUMENTS

WO 96/19792  6/1996  (WO) .

OTHER PUBLICATIONS

Hosokawa et al., "Highly efficient blue electroluminescence from a distrrylarylene emitting layer with a new dopant," 67 *Appl. Phys. Lett.* 3853–3855 (Dec. 1995).

Adachi et al., "Blue light–emitting organic electroluminescent devices," 56 *Appl. Phys. Lett.* 799–801 (Feb. 1990).

H. Vestweber et al., "Electroluminscense from polymer blends and molecularly doped polymers," 64 *Synthetic Metals* 141–145 (1994). (No month avail).

Burrows et al., "Color tunable Organic Light Emitting Devices," 69 *Appl. Phys. Lett.* 2959 (Nov. 11, 1996).

Johnson et al., "Electroluminescence from single layer molecularly doped polymer films", 67 *Pure & Appl. Chem.* pp. 175–182 (1995). (No month avail).

*Primary Examiner*—Bernard Pianalto
(74) *Attorney, Agent, or Firm*—Kenyon & Kenyon

(57) ABSTRACT

The present invention concerns a multicolor display device, comprising a transparent substrate, fluorescent dye deposited in a dye layer onto the substrate by ink jet printing, and a source of radiation for illuminating said fluorescent dye. The present invention also concerns methods for creating such a device.

34 Claims, 2 Drawing Sheets

U.S. PATENT DOCUMENTS

| | | |
|---|---|---|
| 5,294,870 | 3/1994 | Tang et al. . |
| 5,324,359 | 6/1994 | Cleveland . |
| 5,340,656 | 8/1994 | Sachs et al. . |
| 5,387,380 | 2/1995 | Cima et al. . |
| 5,403,617 | 4/1995 | Haaland . |
| 5,459,502 | 10/1995 | Sakaki et al. . |
| 5,478,381 | 12/1995 | Ohiwa et al. . |
| 5,485,188 | 1/1996 | Tochihara et al. . |
| 5,495,803 | 3/1996 | Gerber et al. . |
| 5,753,352 * | 5/1998 | Vanmaele et al. .................. 428/204 |

* cited by examiner

METHOD OF MAKING A DISPLAY

The present application is a division of application Ser. No. 08/772,333, filed Dec. 23, 1996, U.S. Pat. No. 6,013,982.

GOVERNMENT RIGHTS

This invention was made with Government support under Contract No. F33615-94-1-1414 awarded by DARPA. The government has certain rights in this invention.

FIELD OF THE INVENTION

This invention relates to display devices, and more particularly to multicolor display devices having fluorescent dyes deposited by ink jet printing.

BACKGROUND OF THE INVENTION

Display devices utilizing fluorescent media capable of absorbing light and emitting it at a longer wavelength are known. See, e.g., U.S. Pat. No. 5,294,870 to Tang et al., entitled "Organic Electroluminescent Multicolor Image Display Device," the entire disclosure of which is hereby incorporated by reference. However, the fluorescent media in such devices are deposited using patterning techniques such as photolithography which are costly to perform. Hence, there exists a need for a method by which fluorescent media can be inexpensively and accurately deposited on a substrate to produce a multicolor display device.

SUMMARY OF THE INVENTION

The present invention is directed to display devices, each comprising a substrate and fluorescent dye deposited onto the substrate. The present invention further includes methods of making such display devices utilizing ink jet printing techniques. Such devices are advantageous in that the fluorescent dye can be deposited cheaply, over very large or very small areas, with a high degree of resolution. Consequently, they can be used in practically any application where display devices are presently used.

In one embodiment of the present invention, red, green and/or blue fluorescent dyes are ink jet printed onto a transparent substrate to create an image with a predetermined configuration. The thus-created image is thereafter exposed to ultraviolet or other short wavelength radiation to activate the dyes and create a luminous color display. Such a display is "passive" in the sense that the image is fixed in the as-printed configuration.

In another embodiment of the present invention, red, green and/or blue fluorescent dyes are again ink jet printed in a predetermined configuration onto a transparent substrate. A layer of transparent, conductive material is then deposited over the dyes. A layer of organic, blue light emitting device (OBLED) is thereafter deposited over the layer of transparent conductive material, and a conductive layer is deposited over the OBLED layer. Application of a potential across the conductive layers illuminates the OBLED layer, producing a blue emission, which stimulates fluorescent emission in the dyes, so long as the energy of the blue emission is greater than the emission of the dyes.

In another embodiment of the present invention, red, green and blue light emitting regions are ink jet printed in a predetermined configuration onto a transparent substrate. The red and green light emitting regions are formed by ink jet printing red and green fluorescent dyes onto the substrate. No ink is deposited in the blue light emitting regions. Rather, the blue light emitting regions are left as empty spaces while the red and green fluorescent dyes are printed. After the red and green dyes are printed, a layer of transparent, conductive material is deposited over the red and green dyes and the empty spaces left for the blue light emitting regions. A layer of organic, blue light emitting device (OBLED) is thereafter deposited onto the layer of transparent, conductive material. Electrical contacts are then placed on the OBLED in each of the red, green and blue light emitting regions, to facilitate the application of voltage across the OBLED. The OBLED produces a blue emission in the blue light emitting regions, and further, stimulates fluorescent emission in the red and green light emitting regions thereby creating a luminous color display. In this embodiment, the red and green dyes preferably have strong absorption in the blue, and preferably further have high blue-to-red and blue-to-green conversion efficiencies.

In a further embodiment of the present invention, red, green and blue light emitting regions are ink jet printed in the form of pixels onto a transparent substrate. Each pixel has one of each of a red, green and blue light emitting region. This fourth embodiment is made in a manner similar to the third embodiment, the primary difference being that the light emitting regions of the fourth embodiment are arranged in tri-color pixels whereas the light emitting regions of the third embodiment are arranged in some predetermined configuration.

The displays of the present invention can be used in a wide variety of products including a computer, a television, a telecommunications device which incorporates a screen such as a telephone, a vehicle, a billboard or sign, or a large area wall, theater or stadium screen. Moreover, because the display devices of the present invention can be made using any sufficiently flat substrate, it is contemplated the devices can be used in xerography, thereby eliminating the need for lensing in printer bars.

DETAILED DESCRIPTION OF THE INVENTION

Figure 1:
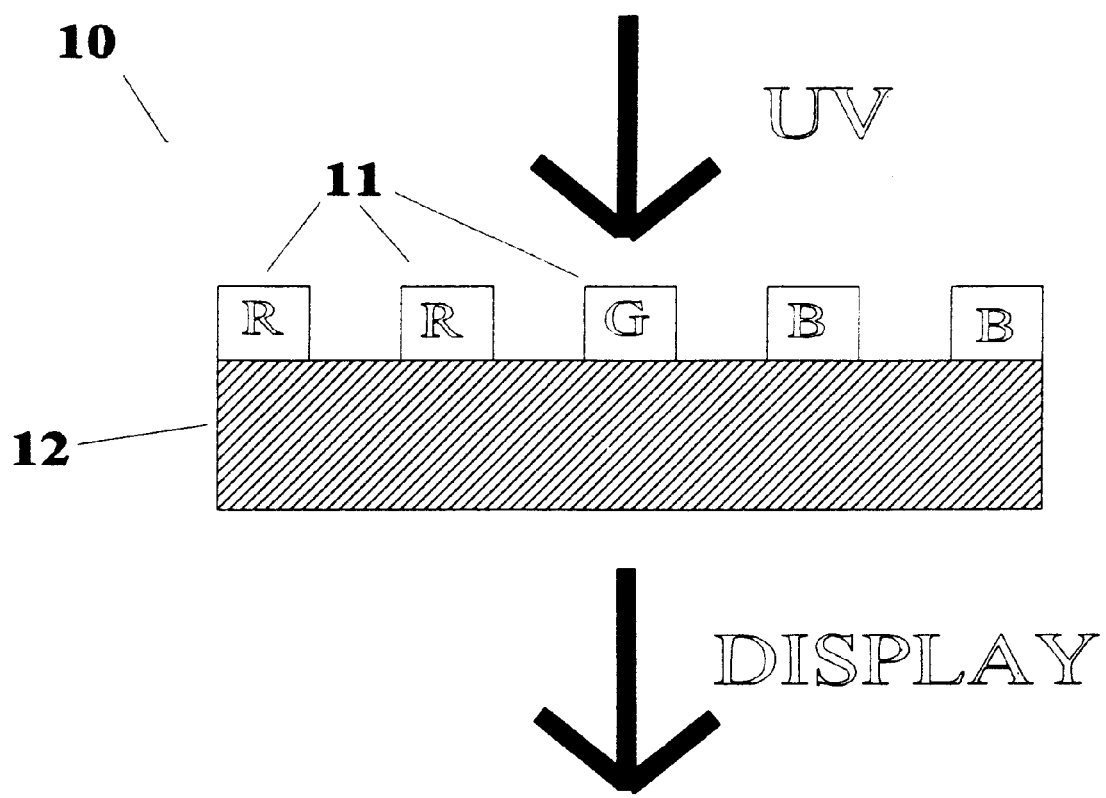
FIG. 1 is a cross-sectional view of a multicolor display device, according to a first embodiment of the invention.

The present invention is directed to the construction of high resolution, full-color displays using printing technologies that deliver small amounts of liquid inks to a substrate in a specified pattern (referred to herein as "ink jet printing").

The liquid inks of the present invention preferably comprise selected fluorescent dyes and a host matrix in a liquid carrier medium. The liquid carrier medium is preferably water, an alcohol such as methanol, ethanol, or isopropanol, or mixtures of the same. The particular carrier medium is typically selected based on its ability to molecularly disperse the fluorescent dyes and on its compatibility with the particular materials with which it comes into contact.

The amount of host matrix is ordinarily selected to yield a viscosity compatible with the ink jet printing process and preferably ranges from about 2 to about 7 wt %. The amount of dye is selected such that it is present in an amount sufficient to give good color intensity, while not being so high that the dye molecules begin to aggregate reducing luminescence intensity. Preferred amounts of dye range from about 0.1 to about 6 wt % of the matrix.

In general, liquid inks of the present invention contain one or more dyes that fluoresce in red, green or blue, which are used to generate a luminescent region of the appropriate hue. The color of the luminescent region is dictated by the fluorescence energy of the dye and the relative proportions of the same. The dyes are preferably chosen to optimize the saturation (i.e., narrow lines at about 460, 520 and 650 nm for blue, green and red, respectively), giving a wide color range for the devices to be manufactured.

Preferred dyes with predominantly blue emission include: 8-anilino-1-napthalenesulfonic acid, 1,3-diphenyl-1,3-butadiene, diphenylhexatriene, Hoescht 33258, Hoescht 33324, thioflavin T, diamidino-2-phenylindole*2HCL, coumarin 152, coumarin 20, coumarin 2, coumarin 339, coumarin 1, coumarin 138, coumarin 102, coumarin 314, and coumarin 30.

Preferred dyes with predominantly green emission include: acridine orange, acridine yellow, acriflavin, dichlorofluorescene, 3,6-diaminoacridine, fluoresceneisothiocyanate, lucifer yellow, quinacrinerhodamine 123, quinacridone, dimethylquiancridone, fluorescene, rhodamine 110, rhodamine 6G, and coumarin 6.

Preferred dyes with predominantly red emission include: xylenol orange, lumogen red, cresyl violet, diethylthiacarbocyanine, ethidium bromide, oxazine 170, nile blue, oxazine 1, 1,3-bis[4-(dimethylamino)phenyl]-2,4-dihydroxycyclobutenediylium, and 1,3-bis[4-(dimethylamino)-2-hydroxyphenyl]-2,4-dihydroxycyclobutenediylium.

In one embodiment, the liquid inks of the present invention are placed into the wells of an ink jet printer, and mixed at individual points on the substrate in ratios appropriate to yield the colors of the desired image at the resolution of the printer (commonly 300–600 dpi). Alternatively, green, blue and red groupings are deposited side-by-side as individual pixels of a full color display. The thickness of the deposited dye layer will be adjusted to optimize luminescent intensity.

The presently preferred ink jet printing device is an Epson Stylus Color 500. While available in a printer, a preferred embodiment of the invention involves the use of a stylus within a plotter. Although more expensive, a plotter improves operation by increasing precision, reducing indexing difficulties (e.g., in the event multiple layers are deposited) and providing nonlinear features (such as interconnects).

The host matrix for the fluorescent dyes of the invention can comprise either polymeric materials or small molecules that readily form stable glassy thin films. Examples of polymeric matrix materials include: polymethylmethacrylate, polyvinylcarbazole, polybutadiene, and polyesters. An example of a small molecule is N,N'-diphenyl-N,N'bis(3-methylphenyl)-1,1'-biphenyl-4,4'-diamine. This is a good glass forming material that can be used as a hole transporter in OLEDs and has its maximum absorption in the UV part of the spectrum. The choice of matrix materials will depend, among other things, on the stability of the different materials under printing conditions, their ability to transmit the ultraviolet light that is used to fluoresce the dyes as well as the light produced by the dyes, and their ability to resist phase separation and stabilize the dyes with respect to aggregation.

The wavelength of the radiation used to fluoresce the dyes is preferably maximized to reduce its energy (and thus its tendency to degrade the display), but must be of greater energy than the light produced by the dyes. For this reason, the wavelength of the radiation is usually in the blue to near-UV range.

The substrate should be dimensioned such that it is flexible enough to accommodate its use in an ink jet printing device and should efficiently transmit ultraviolet radiation, visible radiation or both, depending on the application. The substrate preferably transmits visible and near ultraviolet radiation, while filtering out higher energy ultraviolet radiation. Preferred materials are flexible polyester and glass films (such as Pyrex™), with glass being more preferred due to its low oxygen permeability.

A first embodiment of the present invention is shown in FIG. 1. In this embodiment, a luminous color display (10) is made by ink jet printing regions of fluorescent dye (11) onto the front surface of a substrate (12). The front surface of substrate (12) is thereafter exposed to blue or UV radiation, thus stimulating fluorescent emission of dye (11). The color of the dye region upon exposure can be controlled by varying the relative amounts of red, green and blue dye in the region. Substrate (12) should be transparent to the colors produced by the excited dye (11), while preferably filtering out any high energy UV radiation.

The dye can also be illuminated from the rear surface, with the substrate separating the dye from the radiation source. In this case, the substrate should be transparent to the wavelengths of the blue and/or ultraviolet light that excite the dye, while preferably filtering out high energy UV radiation.

Alternatively, an additional layer can be provided, sandwiching the dye. In this case, one layer separates the dye from the viewer and the other separates the dye from the illumination source. The materials described above are preferred for both layers. The dye can be deposited on either of these layers.

The source of the blue/ultraviolet radiation is not critical. For example, it can be a conventional source such as a fluorescent tube (e.g., a "black light"). As another example, the source can be a simple device such as a planar OBLED layer sandwiched between two planar conductor layers (one of which is transparent to the illumination radiation). A more elaborate version of such a device (e.g., one containing individual electrical connections for each dye region) is discussed in detail below. The ultimate wavelength of the radiation emitted by the source should be shorter than the shortest wavelength of light emitted by the dye.

The display of FIG. 1 is "passive" in that it is limited to the printed configuration, and individual printed regions of fluorescent dye are not individually illuminated. One advantage of this device is that no individual electrical connections are needed for each region.

Figure 2:
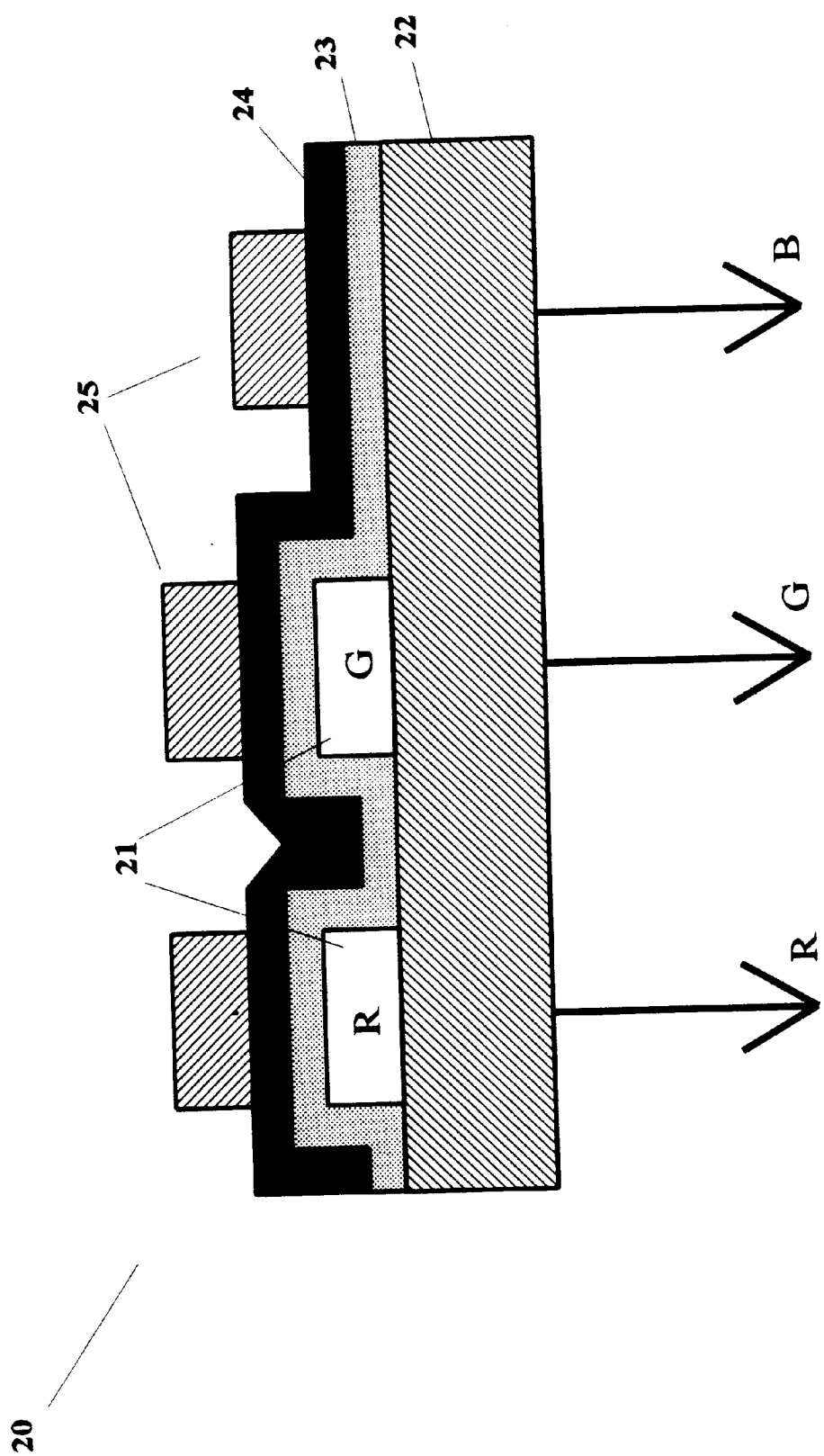
FIG. 2 is a cross-sectional view of a multicolor display device, according to a second embodiment of the invention.

Additional embodiments of the device structure of the present invention are constructed based on the arrangements shown in FIG. 2. In these embodiments, red and green fluorescent dyes (21) are ink jet printed onto a transparent substrate (22) such as glass; a transparent, conductive layer (23) is deposited over the red and green dye; an organic blue light emitting device (OBLED) layer (24) is deposited over the transparent, conductive layer; and electrical contacts (25) are deposited onto the OBLED layer.

A preferred material for the transparent, conductive layer (23) is indium-tin oxide (ITO). One desirable property indium-tin oxide is its ability to filter out destructive, high energy ultraviolet radiation, while being transparent to visible and near-ultraviolet radiation.

Layer (23) can be formed by means of conventional sputtering or electron beam vapor deposition methods, and typically ranges in thickness from about 1000 to about 4000 Å. Below a certain thickness the resistance of the layer will begin to suffer, while above a certain thickness marginal utility becomes negligible. The deposition of layer (23) is preferably conducted under vacuum.

After conductive layer (23) is deposited, OBLED layer (24) is preferably deposited by thermal evaporation methods to a thickness which is often 400–1000 Å. The ultimate thickness will depend upon the OBLED. Preferably, this thickness will be as thin as possible to lower the voltage of the device, without significantly compromising quantum efficiency. The deposition of layer (24) is preferably conducted under vacuum. It is preferred that the device not be exposed to moisture, oxygen or other contaminants between the deposition of layers (23) and (24).

OBLED layer (24) is made from any suitable blue light-emissive organic compounds such as, for example, metal bidentate ligand complexes, and aromatic and heterocyclic polymers, as hereinafter described.

As seen in PCT International Publication Number WO 96/19792 entitled "Multicolor Organic Light Emitting Devices," the disclosure of which is hereby incorporated by reference, the metal bidentate complexes which may be used for layer (24) have the formula $MDL^4_2$ wherein M is selected from trivalent metals of Groups 3–13 of the Periodic Table and Lanthanides. The preferred metal ions are $Al^{+3}$, $Ga^{+3}$, $In^{+3}$ and $Sc^{+3}$. D is a bidentate ligand such as 2-picolylketones, 2-quinaldylkentones and 2-(o-phenoxy) pyridine ketones. The preferred groups for $L^4$ include acetylacetonate, compounds of the formula $OR^3R$ wherein $R^3$ is selected from Si and C, and R is selected from hydrogen, substituted and unsubstituted alkyl, aryl and heterocyclic groups; 3,5-di(t-bu)phenol; 2,6-di(t-bu)phenol; 2,6-di(t-bu)cresol; and $H_2Bpz_2$. By way of example, the wavelength resulting from measurement of photoluminescence in the solid state of aluminum(picolymethylketone) bis[2,6-di(t-bu)phenoxide] is 420 nm. The cresol derivative of this compound also measured 420 nm. Aluminum (picolylmethylketone)bis(OsiPh$_3$) and scandium(4-methoxy-picolylmethylketone)bis(acetylacetonate) each measured 433 nm, while aluminum[2-(O-phenoxy)pyridine] bis[2,6-di(t-bu)phenoxide] measured 450 nm.

Polymers of aromatic and heterocyclic compounds which are fluorescent in the solid state may be used for layer (24). Examples of such polymers include poly(phenylene), and poly(N-vinylcarbazole).

Additional OLED materials are known in the art (see, e.g., U.S. Pat. No. 5,294,870 to Tang et al., entitled "Organic Electroluminescent Multicolor Image Display Device"; Hosokawa et al., "Highly efficient blue electroluminescence from a distyrylarylene emitting layer with a new dopant," *Appl. Phys. Lett.*, 67 (26) Dec. 25, 1995, pp. 3853≧3855; Adachi et al., "Blue light-emitting organic electroluminescent devices," *Appl. Phys. Lett.*, 56 (9) Feb. 26, 1990, pp. 799–801; Burrows et al., "Color-Tunable Organic Light Emitting Devices," *Appl. Phys. Lett.*, Vol. 69, Nov. 11, 1996, pp. 2959–2961). The entire disclosures of these references are hereby incorporated by reference.

Distyrylarylene derivatives such as those described in Hosokawa et al. are a preferred class of compounds. Other preferred OLEDs are described in the copending applications discussed below.

The deposition of electrical contacts (25) may be accomplished by vapor deposition or other suitable metal deposition techniques. A preferred method of depositing such contacts is by ink jet printing as disclosed, for example, in U.S. Pat. Nos. 4,668,533, 5,132,248 and 5,266,098, the disclosures of which are hereby incorporated by reference in their entireties. These electrical contacts may be made from indium, platinum, gold, silver or combinations such as Ti/Pt/Au, Cr/Au or Mg/Ag. Mg/Ag contacts are preferred.

The embodiments discussed above in connection with FIG. 2 have substantially the same device structure, the primary difference being that the light emitting regions of one embodiment are arranged in pixels, and is therefore useful for creating active displays such as flat-screen monitors and the like. In comparison, the light emitting regions of the other embodiment are arranged in some predetermined configuration. This embodiment is therefore compatible with "writing" special purpose logos, alpha numerics, segmental displays using red, green and blue regions as described above, or mixing appropriate amounts of red, green and blue in a given region to achieve a special color for that part of the display.

In view of the above, it can be seen that the display devices of the present invention are appropriate for an extremely wide variety of applications including billboards and signs, computer monitors, telecommunications devices such as telephones, televisions, large area wall screens, theater screens and stadium screens.

The subject invention as disclosed herein may be used in conjunction with the subject matter of co-pending applications "High Reliability, High Efficiency, Integratable Organic Light Emitting Devices and Methods of Producing Same", "Novel Materials for Multicolor LED's", "Electron Transporting and Light Emitting Layers Based on Organic Free Radicals", "Red-Emitting Organic Light Emitting Devices (LED's)" and "High Efficiency Organic Light Emitting Device Structures," each co-pending application being filed on even date herewith, and each being herein incorporated by reference in its entirety. The subject invention as disclosed herein may also be used in conjunction with the subject matter of co-pending applications U.S. Ser. Nos. 08/354,674; 08/613,207; 08/632,316; 08/632,322; 08/693,359; 60/010,013; and 60/024,001; and each is also herein incorporated by reference in its entirety.

The following Examples are merely illustrative of the present invention and are in no way intended to limit the scope of the present invention.

EXAMPLE 1

Generating a Passive Picture to Be Back Lit With UV

In order to print a fluorescent image or pixel array with an ink jet printer or other ink delivery system, the inks are first prepared to match the optimal viscosity and other solution properties of the chosen printer. These inks consist of a carrier solvent, roughly 1–10 weight % matrix material and 0.001–0.05 weight % fluorescent dye. The dye is chosen to achieve a desired hue (typically red, green or blue) and the matrix material is chosen to give a stable film which supports the dyes and prevents aggregation. The three wells of the printer are charged with the red, green and blue inks. The image is printed directly onto a polymeric or glass substrate. The inks are mixed by the ink jet printer at each pixel, if needed to achieve the appropriate color. The brightness at each pixel is adjusted by varying the total amount of ink deposited at each pixel. A small amount of ink will allow most of the irradiating light to pass through the film giving very little visible light. A larger amount of ink deposited will give a significant absorbance and thus a relatively larger amount of visible light from dye fluorescence. The color of each pixel is strictly determined by the ratios of the individual red, green and blue inks.

EXAMPLE 2
Generating a Passive Picture Back Lit With OLEDs

To print a fluorescent image or pixel array with an ink jet printer or other ink delivery system, the inks are first prepared to match the optimal viscosity and other solution properties of the chosen printer. These inks consist of a carrier solvent, roughly 1–10 weight % matrix material and 0.001–0.05 weight % fluorescent dye. The dye is chosen to achieve a desired hue (typically red, green or blue) and the matrix material is chosen to give a stable film which supports the dyes and prevents aggregation. The three wells of the printer are charged with the red, green and blue inks. The image is printed directly onto a polymeric or glass substrate. The inks are mixed by the ink jet printer at each pixel, if needed to achieve the appropriate color. The color of each pixel is strictly determined by the ratios of the individual red, green and blue inks. The thickness of the fluorescent films will be chosen to achieve a transparency of less than 10% at the intended irradiation wavelength. A layer of transparent conducting material is then applied to the entire printed substrate. This conductive material is indium-tin oxide (deposited by spattering) or a conducting polymer (applied by spray on or other large area technique) or any other transparent conductive material that may be used as the anode in an OLED. Multiple organic layers are then deposited over the entire substrate to make an active multilayer OLED structure. The composition and structure of these organic multilayers are chosen to match the output of the OLEDs to the absorption spectra of the chosen red, green and blue dyes, and are well known to those skilled in the art of fabrication or organic light emitting devices. A mask is then applied and a film of a low work function metal is deposited above each pixel defined by the ink jet printer. Applying a bias between the conductive film and the metal electrode gives light which stimulates the dye region giving red, green and blue emission. The brightness at each pixel is controlled by setting the current level at the OLED. The color of a given pixel is controlled by the ratio of red to green to blue fluorescent dyes in the film.

EXAMPLE 3
Generating a Pixel Array Back Lit With OBLEDs

To print a fluorescent image or pixel array with an ink jet printer or other ink delivery system, the inks are first prepared to match the optimal viscosity and other solution properties of the chosen printer. These inks consist of a carrier solvent, roughly 1–10 weight % matrix material and 0.001–0.05 weight % fluorescent dye. The dye is chosen to achieve a desired hue (red and green) and the matrix material is chosen to give a stable film which supports the dyes and prevents aggregation. The wells of the printer are charged with the red and green inks. The image is printed directly onto a polymeric or glass substrate. The printer is used to deposit individual red and green fluorescent elements on the substrate. The thickness of the red and green fluorescent films are chosen to achieve a transparency of less than 10% at the intended irradiation wavelength. A layer of transparent conducting material is then applied to the entire printed substrate. This conductive material can be indium-tin oxide (deposited by sputtering) or a conducting polymer (applied by spray on or other large area technique) or any other transparent conductive material that may be used as the anode in an OLED. Multiple organic layers are then deposited over the entire substrate top make an active multilayer OBLED structure. The composition and structure of these organic multilayers are chosen to match the output of the OBLEDs to the absorption spectra of the chosen red and green dyes, and are well known to those skilled in the art of fabrication or organic light emitting devices. A mask is then applied and a film of a low work function metal is deposited above each pixel defined by the ink jet printer. Applying a bias between the conductive film and the metal electrode gives light which stimulates the dye region giving red or green emission, whose intensity is directly dependent on the intensity of the OBLED used in irradiating it. The brightness at each pixel is controlled by setting the current level at the OBLED. The regions of the substrate that are not covered with the red or green fluorescent dye will be open and blue light from the OBLED will be transmitted. Color mixing is achieved controlling the intensity of the individual red, green and blue pixels.

What is claimed is:

1. A method for creating a display device, comprising:
    providing a transparent substrate;
    depositing ink, by ink jet printing, over said substrate, wherein said ink comprises a fluorescent dye, resulting in a coated transparent substrate; and
    depositing a light emitting layer over said coated transparent substrate; wherein said light emitting layer is capable of emitting light of a wavelength shorter than the wavelength of light emitted from said fluorescent dye upon activation thereof by light emitted from said light emitting layer.

2. The method of claim 1, wherein said substrate is transparent to visible radiation, and wherein said ink is deposited over said substrate in a pattern forming a plurality of light emitting regions, at least a portion of said light emitting regions comprising one or more fluorescent dyes selected from the group consisting of a red fluorescent dye, a green fluorescent dye and a blue fluorescent dye.

3. The method of claim 2, said method further comprising:
    depositing a transparent, first conductive layer over said light emitting regions;
    depositing said light emitting layer over said conductive layer, wherein said light emitting layer is an organic blue light emitting device; and
    depositing a second conductive layer over said light emitting layer.

4. The method of claim 2 or 3, wherein said light emitting regions comprise red, green, and blue light emitting regions arranged in a predetermined configuration.

5. The method of claim 4, wherein
    said red, green and blue light emitting regions are arranged in pixels, each pixel comprising one red light emitting region, one green light emitting region and one blue light emitting region; and
    an electrical contact is formed across said organic blue light emitting device in each of said red, green and blue light emitting regions.

6. The method of claim 4, wherein
    each of said red light emitting regions comprises a red fluorescent dye region and each of said green light emitting regions comprises a green fluorescent dye region; and
    when an electrical contact is formed across said organic blue light emitting device said organic blue light emitting device directly emits blue light in each of the blue light emitting regions, and said organic blue light stimulates the fluorescent dye in each of the red and green light emitting regions.

7. A method of using said display device created by the method of claim 3, comprising:
    applying a potential across said first and second conductive layers, causing said light emitting layer to produce an emission of light radiation; and exposing said ink comprising fluorescent dye to said light radiation, thereby stimulating fluorescent emission of said dye.

8. A method for creating a display device, comprising:

providing a transparent substrate;

depositing ink, by ink jet printing, over said substrate, wherein said ink comprises a fluorescent dye, resulting in a substrate having a coated surface and a non-coated surface; and depositing a light emitting layer over the non-coated surface of said transparent substrate; wherein said light emitting layer is capable of emitting light of a wavelength shorter than the wavelength of light emitted from said fluorescent dye upon activation thereof by light emitted from said light emitting layer.

9. The method of claim 1 or 8, wherein said substrate is transparent to ultraviolet radiation.

10. The method of claim 1 or 8, wherein the depositing ink results in a partially coated surface.

11. The method of claim 1 or 8, wherein the depositing ink results in a completely coated surface.

12. The method of claim 1 or 8, wherein said ink comprises one or more fluorescent dyes, a matrix material and a liquid carrier medium.

13. The method of claim 12, wherein said ink comprises from about 2 to about 7 weight percent matrix material.

14. The method of claim 12, wherein said dye is present in an amount ranging from about 0.1 to about 6 weight percent relative to said matrix material.

15. The method of claim 12, wherein the matrix material is selected from the group consisting of polymethylmethacrylate, polyvinylcarbazole, polybutadiene, polyesters and N,N'-diphenyl-N,N'bis(3-methylphenyl)-1,1'-biphenyl-4,4'-diamine.

16. The method of claim 1 or 8, wherein said transparent substrate is selected from the group consisting of glass and polyester.

17. A method for creating a display device, comprising:

providing a transparent substrate;

depositing ink, by ink jet printing, over said substrate, wherein said ink comprises a fluorescent dye, resulting in a coated transparent substrate; and depositing a light emitting layer over said coated transparent substrate; wherein said light emitting layer is capable of emitting light of a wavelength of about 530 to about 360 nanometers upon activation thereof by light emitted from said light emitting layer.

18. The method of claim 17, wherein said substrate is transparent to visible radiation, and wherein said ink is deposited over said substrate in a pattern forming a plurality of light emitting regions, at least a portion of said light emitting regions comprising one or more fluorescent dyes selected from the group consisting of a red fluorescent dye, a green fluorescent dye and a blue fluorescent dye.

19. The method of claim 18, said method further comprising:

depositing a transparent, first conductive layer over said light emitting regions;

depositing said light emitting layer over said conductive layer, wherein said light emitting layer is an organic blue light emitting device; and depositing a second conductive layer over said light emitting layer.

20. The method of claim 18 or 19, wherein said light emitting regions comprise red, green, and blue light emitting regions arranged in a predetermined configuration.

21. The method of claim 20, wherein said red, green and blue light emitting regions are arranged in pixels, each pixel comprising one red light emitting region, one green light emitting region and one blue light emitting region; and an electrical contact is formed across said organic blue light emitting device in each of said red, green and blue light emitting regions.

22. The method of claim 20, wherein each of said red light emitting regions comprises a red fluorescent dye region and each of said green light emitting regions comprises a green fluorescent dye region; and when an electrical contact is formed across said organic blue light emitting device said organic blue light emitting device directly emits blue light in each of the blue light emitting regions, and said organic blue light stimulates the fluorescent dye in each of the red and green light emitting regions.

23. A method of using said display device created by the method of claim 19, comprising:

applying a potential across said first and second conductive layers, causing said light emitting layer to produce an emission of light radiation; and exposing said ink comprising fluorescent dye to said light radiation, thereby stimulating fluorescent emission of said dye.

24. A method for creating a display device, comprising:

providing a transparent substrate;

depositing ink, by ink jet printing, over said substrate, wherein said ink comprises a fluorescent dye, resulting in a substrate having a coated surface and a non-coated surface; and depositing a light emitting layer over the non-coated surface of said transparent substrate; wherein said light emitting layer is capable of emitting light of a wavelength of about 530 to about 360 nanometers, upon activation thereof by light emitted from said light emitting layer.

25. The method of claim 17 or 24, wherein said substrate is transparent to ultraviolet radiation.

26. The method of claim 17 or 24, wherein the depositing ink results in a partially coated surface.

27. The method of claim 17 or 24, wherein the depositing ink results in a completely coated surface.

28. The method of claim 17 or 24, wherein said ink comprises one or more fluorescent dyes, a matrix material and a liquid carrier medium.

29. The method of claim 28, wherein said ink comprises from about 2 to about 7 weight percent matrix material.

30. The method of claim 28, wherein said dye is present in an amount ranging from about 0.1 to about 6 weight percent relative to said matrix material.

31. The method of claim 29, wherein the matrix material is selected from the group consisting of polymethylmethacrylate, polyvinylcarbazole, polybutadiene, polyesters and N,N'-diphenyl-N,N'bis(3-methylphenyl)-1,1'-biphenyl-4,4'-diamine.

32. The method of claim 17 or 24, wherein said transparent substrate is selected from the group consisting of glass and polyester.

33. A method for creating a display device, comprising:

providing a transparent substrate;

depositing ink, by ink jet printing, over said substrate, wherein said ink comprises a fluorescent dye, resulting in a coated transparent substrate; and arranging a layer of organic, blue light emitting device over said coated transparent substrate, wherein said organic, blue light emitting device is capable of emitting ultraviolet or blue light radiation, and wherein said light emitting device is positioned so as to irradiate said coated transparent substrate when ultraviolet or blue light radiation is emitted therefrom.

34. A method for creating a display device, comprising:

providing a transparent substrate;

depositing ink, by ink jet printing, over said substrate, wherein said ink comprises a fluorescent dye, resulting in a substrate having a coated surface and a non-coated surface; and arranging a layer of organic, blue light emitting device over the non-coated surface of said transparent substrate, wherein said organic, blue light emitting device is capable of emitting ultraviolet or blue light radiation, and wherein said light emitting device is positioned so as to irradiate said coated transparent substrate when ultraviolet or blue light radiation is emitted therefrom.

* * * * *

UNITED STATES PATENT AND TRADEMARK OFFICE
CERTIFICATE OF CORRECTION

PATENT NO. : 6,245,393 B1
DATED : June 12, 2001
INVENTOR(S) : Thompson et al.

Page 1 of 1

It is certified that error appears in the above-identified patent and that said Letters Patent is hereby corrected as shown below:

<u>Column 5,</u>
Line 50, after "Dec. 25, 1995," change "pp. 3853≥3855" to -- pp. 3853-3855 --; and <u>Column 7,</u>
Line 21, change "spattering" to -- sputtering --.

Signed and Sealed this

Fifth Day of March, 2002

Attest:

JAMES E. ROGAN
*Attesting Officer*     *Director of the United States Patent and Trademark Office*